(12) United States Patent
Eberhardt et al.

(10) Patent No.: US 9,688,910 B2
(45) Date of Patent: Jun. 27, 2017

(54) CONVERSION ELEMENT, COMPONENT AND PROCESS FOR PRODUCING A COMPONENT

(71) Applicant: OSRAM GmbH, Munich (DE)

(72) Inventors: Angela Eberhardt, Augsburg (DE); Christina Wille, Friedberg (DE)

(73) Assignee: OSRAM GmbH, München (DE)

( * ) Notice: Subject to any disclaimer, the term of this patent is extended or adjusted under 35 U.S.C. 154(b) by 0 days.

(21) Appl. No.: 15/102,892

(22) PCT Filed: Dec. 15, 2014

(86) PCT No.: PCT/EP2014/077824
§ 371 (c)(1),
(2) Date: Jun. 9, 2016

(87) PCT Pub. No.: WO2015/091393
PCT Pub. Date: Jun. 25, 2015

(65) Prior Publication Data
US 2016/0304776 A1 Oct. 20, 2016

(30) Foreign Application Priority Data
Dec. 19, 2013 (DE) .......................... 10 2013 226 630

(51) Int. Cl.
*H01L 33/50* (2010.01)
*C09K 11/02* (2006.01)
(Continued)

(52) U.S. Cl.
CPC ............ *C09K 11/025* (2013.01); *C03C 3/122* (2013.01); *C03C 3/125* (2013.01); *C03C 4/12* (2013.01);
(Continued)

(58) Field of Classification Search
CPC ..... C09K 11/025; C09K 11/02; H01L 33/502; H01L 2933/0041; C03C 3/125;
(Continued)

(56) References Cited

U.S. PATENT DOCUMENTS 7,033,966 B2   4/2006   Kobayashi et al.
8,110,513 B2   2/2012   Ueda et al.
(Continued)

FOREIGN PATENT DOCUMENTS

CN       101812299 A      8/2010
DE    102005023134 A1    11/2006
(Continued)

OTHER PUBLICATIONS

Segawa, H et al., "Fabrication of Glasses of Dispersed Yellow Oxynitride Phosphor for White Light-Emitting Diodes", Elsevier, Optical Materials 33, May 28, 2010, 6 pages.
(Continued)

*Primary Examiner* — David Vu
(74) *Attorney, Agent, or Firm* — Slater Matsil, LLP

(57) ABSTRACT

A conversion element, a component and a method for producing the component are disclosed. In an embodiment the conversion element includes a phosphor configured to convert electromagnetic primary radiation into electromagnetic secondary radiation and a glass composition as matrix material in which the phosphor is embedded. The glass composition has the following chemical composition: at least one tellurium oxide with a proportion of 65 mole % as a minimum and 90 mole % as a maximum, $R^1O$ with a proportion of between 0 mole % and 20 mole %, at least one $M^1_2O$ with a proportion of between 5 mole % and 25 mole %, at least one $R^2_2O_3$ with a proportion of between 1 mole
(Continued)

% and 3 mole %, $M^2O_2$ with a proportion of between 0 mole % and 2 mole %, and $R^3_2O_5$ with a proportion of between 0 mole % and 6 mole %.

18 Claims, 10 Drawing Sheets

(51) Int. Cl.
*C03C 3/12* (2006.01)
*C03C 4/12* (2006.01)
*C03C 14/00* (2006.01)

(52) U.S. Cl.
CPC ............ *C03C 14/006* (2013.01); *C09K 11/02* (2013.01); *H01L 33/502* (2013.01); *C03C 2204/02* (2013.01); *C03C 2214/16* (2013.01); *C03C 2214/30* (2013.01); *H01L 2933/0041* (2013.01)

(58) Field of Classification Search
CPC ......... C03C 14/006; C03C 4/12; C03C 3/122; C03C 2214/16
See application file for complete search history.

(56) References Cited

U.S. PATENT DOCUMENTS

| | | | |
|---|---|---|---|
| 8,729,788 B2* | 5/2014 | Masuda | ............ C09K 11/0883 313/487 |
| 2007/0012940 A1* | 1/2007 | Suh | ..................... H01L 33/507 257/99 |
| 2011/0143627 A1 | 6/2011 | Becker et al. | |
| 2013/0056725 A1 | 3/2013 | Eberhardt et al. | |
| 2013/0267051 A1 | 10/2013 | Petersen | |
| 2014/0127464 A1 | 5/2014 | Eberhardt et al. | |

FOREIGN PATENT DOCUMENTS

| | | |
|---|---|---|
| DE | 102010009456 A1 | 9/2011 |
| DE | 102010054280 A1 | 6/2012 |
| DE | 102011078663 A1 | 1/2013 |
| DE | 102012220980 A1 | 5/2014 |
| GB | 1216514 A | 12/1970 |
| WO | 0127047 A2 | 4/2001 |
| WO | 2011104364 A1 | 9/2011 |

OTHER PUBLICATIONS

Nang, G et al., "Thermal Stability, Spectra and Laser Properties of Yb: Lead-Zinc-Telluride Oxide Glasses", Journal of Non-Crystalline Solids, North-Holland Physics Publishing, May 1, 2004, 5 pages, vol. 336, No. 2, 1, Amsterdam, NL.

Zambelli, M et al., "Optical Spectroscopy of Lanthanide Ions in Al2O3—Nb2O5—TeO2 Glasses", Optical Materials, Elsevier Science Publishers B.V., Mar. 1, 2004, 8 pp., vol. 25, No. 2, Amsterdam, NL.

* cited by examiner

Fig. 1

| Glaszusammensetzung | A1 | A2 | A3 | A4 | A5 | A6 | A7 | V1 | V2 | V3 | V4 |
|---|---|---|---|---|---|---|---|---|---|---|---|
| TeO$_2$ | 68,5 | 68,25 | 68,5 | 68,5 | 67,5 | 68,25 | 68,5 | 70 | 75 | 60 | 85 |
| ZnO | 18 | 20 | 18 | 18 | 18 | 18 | 18 | | 20 | 40 | 10 |
| Na$_2$O | 12 | 10 | 12 | 12 | 12 | 12 | 12 | 25 | 5 | | |
| Nb$_2$O$_5$ | | 1,75 | | | | | | | | | 5 |
| Al$_2$O$_3$ | | | | | 2,5 | 1,75 | 1,5 | | | | |
| BaO | | | | | | | | 5 | | | |
| La$_2$O$_3$ | 1,5 | | | | | | | | | | |
| Bi$_2$O$_3$ | | | 1,5 | | | | | | | | |
| Y$_2$O$_3$ | | | | 1,5 | | | | | | | |
| Tg [°C] | 288 | 294 | 292 | 283 | 294 | 291 | 292 | 272 | 296 | 216 | 321 |
| α (100-200 °C) [*10$^{-6}$K$^{-1}$] | | | | | 19 | 19,7 | | | 19,3 | | |
| Te [°C] | 314 | | 308 | 308 | 316 | 323 | 318 | | 329 | | 341 |
| n | | 2,0 | | | 2,0 | 2,0 | | | | | |

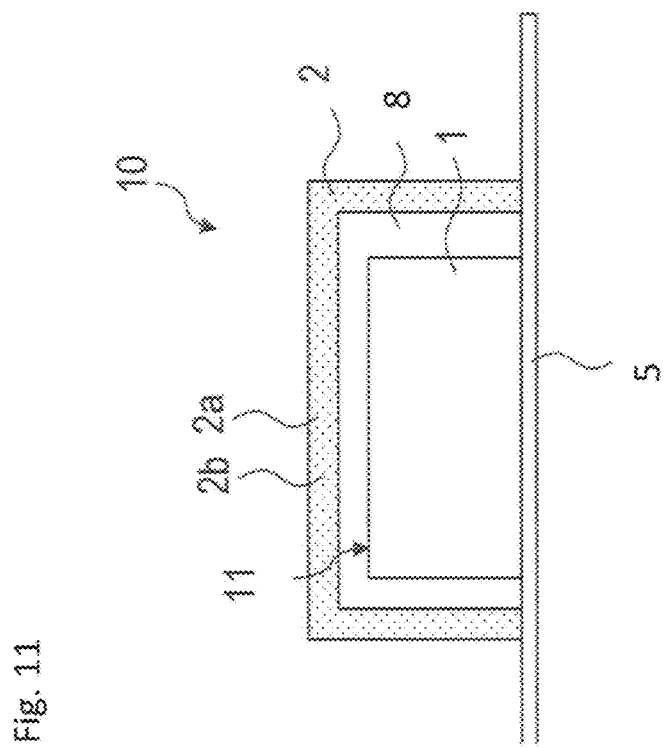

US 9,688,910 B2

CONVERSION ELEMENT, COMPONENT AND PROCESS FOR PRODUCING A COMPONENT

This patent application is a national phase filing under section 371 of PCT/EP2014/077824, filed Dec. 15, 2014, which claims the priority of German patent application 10 2013 226 630.8, filed Dec. 19, 2013, each of which is incorporated herein by reference in its entirety.

TECHNICAL FIELD

A conversion element is provided. A component as well as a method for producing such a component are also provided.

BACKGROUND

A conventional conversion element usually comprises silicone as matrix material in which the phosphor is present in an embedded state. However, silicone demonstrates poor heat conductivity, which causes the phosphor to heat up more intensely during operation and thus become less efficient. In addition, the refractive index of silicone equals approximately 1.4 and perceptibly differs from that of garnet phosphors, for example, the refractive index of which equals approximately 1.8. This difference leads to a stronger scattering, in particular if very small phosphor particles are embedded. This fine portion has thus previously been removed from the powder by fractionation.

A problem addressed by the invention is to provide a conversion element that has improved properties. In particular, the conversion element should demonstrate high heat conductivity. In particular, the conversion element should have a refractive index that is adjusted to the refractive index of a phosphor embedded in the conversion element.

Another problem addressed by the invention is to provide a component that is particularly stable and can in particular be produced at temperatures below 400° C.

In particular, any temperature-sensitive phosphor embedded in the conversion element should not be damaged during the production of the component.

A further problem addressed by the invention is that of, where possible, embedding all known various types of phosphor in a matrix material, in order to thus configure any desired color of light. That is an advantage compared with a conversion ceramic known from prior art, which can only be produced in specific colors of light. A combination of conversion ceramic, or of a conversion element and a phosphor embedded in a glass composition or a glass as matrix material, also allows the color spectrum of the conversion ceramic or of the conversion element to be advantageously expanded. This requires a matrix material in the conversion element, which does not undergo chemical reactions with any of the phosphors during the embedding process, which could involve a degradation of the phosphors. This property is strongly dependent on the composition of the matrix material, which is why only selected matrix materials are suitable.

SUMMARY OF THE INVENTION

Pursuant to at least one embodiment, the conversion element comprises a phosphor, which is set up (also configured to, adapted) for converting electromagnetic primary radiation into electromagnetic secondary radiation, and a glass composition as matrix material in which the phosphor is embedded, wherein the glass composition comprises the following chemical composition: at least one tellurium oxide with a proportion of 65 mole % as a minimum and 90 mole % as a maximum, $R^1O$ with a proportion of between 0 mole % and 20 mole %, wherein $R^1$ is selected from a group comprising or consisting of Mg, Ca, Sr, Ba, Zn, Mn and combinations thereof, at least one $M^1{}_2O$ with a proportion of between 5 mole % and 25 mole %, wherein $M^1$ is selected from a group comprising or consisting of Li, Na, K and combinations thereof, at least one $R^2{}_2O_3$ with a proportion of between 1 mole % and 3 mole %, wherein $R^2$ is selected from a group comprising Al, Ga, In, Bi, Sc, Y, La, rare earths and combinations thereof, $M^2O_2$ with a proportion of between 0 mole % and 2 mole %, wherein $M^2$ is selected from a group comprising or consisting of Ti, Zr, Hf and combinations thereof, and $R^3{}_2O_5$ with a proportion of between 0 mole % and 6 mole %, wherein $R^3$ is Nb and/or Ta.

Surprisingly, it has been shown that the above-described glass or glass composition is very suitable as matrix material for at least one phosphor, as no chemical reactions occur during the embedding process, which cause a degradation of the phosphor. In particular, this is a challenge for temperature-sensitive non-oxidic phosphors.

The inventors have realized that the conversion element described herein, in particular the matrix material has a very low sintering point and is thus very suitable for temperature-sensitive phosphors. Furthermore, the matrix material has a low softening temperature. Said matrix material is highly transparent and/or highly refractive. The matrix material also has a low crystallization tendency. It is additionally corrosion-resistant, in particular in warm, humid atmospheres, such as, for example, a humidity test at 85° C. and 85% rel. humidity over 1000 hours. The matrix material in the conversion element is thus very suitable for optical uses. A lower scattering on the basis of the low refractive index difference between matrix material and phosphor is the result. Furthermore, efficiency can be increased when using the conversion element in a component, as the heat can be better dissipated from the phosphor via the matrix material and the phosphor suffers less damage.

Pursuant to at least one embodiment, the glass composition is free of boron trioxide, germanium oxide, phosphates, halides, $P_2O_5$ and $SiO_2$ and the glass composition has a glass transformation temperature of less than 320° C. and a dilatometric softening temperature of less than 400° C. In particular, such a glass composition has surprisingly proven to be particularly humidity-resistant. That means that the glass composition remains stable, even during a particularly difficult humidity test, in which the glass composition is exposed to a relative humidity of 80% as a minimum, in particular 85%, at 80° C. as a minimum, in particular at 85° C., for more than 900 hours, in particular for 1000 hours.

Pursuant to at least one embodiment, the total of all proportions of tellurium oxide, $M^1{}_2O$, $R^2{}_2O_3$ and, if need be, $M^2O_2$, $R^1O$ and $R^3{}_2O_5$ in the matrix material is 100% or 100 mole %, if no further elements or components are contained, or less than 100% or 100% mole %, if further components in addition to the above-stated components, such as tellurium oxide, $M^1{}_2O$, $R^2{}_2O_3$ and, if need be, $M^2O_2$, $R^1O$ and $R^3{}_2O_5$, are contained.

Pursuant to at least one embodiment, the matrix material consists of tellurium oxide with a proportion of 65 mole % as a minimum and 90 mole % as a maximum inclusively, $R^1O$ with a proportion of between 0.1 mole % and 15 mole % inclusively and $R^2{}_2O_3$ with a proportion of between 1 mole % and 3 mole % inclusively. "Consist of" here can mean that no further components are contained in the composition. Alternatively, "consist of" can mean that further components are only contained in a low proportion in the ppm range (parts per million) in the glass composition and constitute substantially unavoidable impurities in the glass starting materials.

Pursuant to at least one embodiment, the matrix material, in particular the glass composition, consists of $TeO_2$, ZnO, $Na_2O$ and $R^2{}_2O_3$ where $R_2$ is selected from the group: aluminum, lanthanum, bismuth and yttrium and rare earths. The total of all proportions in the glass composition is 100% or 100 mole %.

Pursuant to at least one embodiment, the matrix material, in particular the glass composition, is obtainable from: at least one tellurium oxide with a proportion of 65 mole % as a minimum and 90 mole % as a maximum, $R^1O$ with a proportion of between 0 mole % and 20 mole %, wherein $R^1$ is selected from a group comprising Mg, Ca, Sr, Ba, Zn, Mn and combinations thereof, at least one $M^1{}_2O$ with a proportion of between 5 mole % and 25 mole %, wherein $M^1$ is selected from a group comprising Li, Na, K and combinations thereof, at least one $R^2{}_2O_3$ with a proportion of between 1 mole % and 3 mole %, wherein $R^2$ is selected from a group comprising Al, Ga, In, Bi, Sc, Y, La, rare earths and combinations thereof, $M^2O_2$ with a proportion of between 0 mole % and 2 mole %, wherein $M^2$ is selected from a group comprising Ti, Zr, Hf and combinations thereof, and $R^3{}_2O_5$ with a proportion of between 0 mole % and 6 mole %, wherein $R^3$ is Nb and/or Ta.

This means that weighing out the above-stated components with the corresponding proportions and, if need be, taking further steps enables a glass composition to be generated as matrix material. In particular, the proportion of the amount of the weighed out components corresponds to the proportion of the components in the glass composition with a maximum deviation of 5%.

Pursuant to at least one embodiment, the matrix material, in particular the glass composition, consists of: at least one tellurium oxide with a proportion of 65 mole % as a minimum and 90 mole % as a maximum, $R^1O$ with a proportion of between 0 mole % and 20 mole %, wherein $R^1$ is selected from a group comprising Mg, Ca, Sr, Ba, Zn, Mn and combinations thereof, at least one $M^1{}_2O$ with a proportion of between 5 mole % and 25 mole %, wherein $M^1$ is selected from a group comprising Li, Na, K and combinations thereof, at least one $R^2{}_2O_3$ with a proportion of between 1 mole % and 3 mole %, wherein $R^2$ is selected from a group comprising Al, Ga, In, Bi, Sc, Y, La, rare earths and combinations thereof, $M^2O_2$ with a proportion of between 0 mole % and 2 mole %, wherein $M^2$ is selected from a group comprising Ti, Zr, Hf and combinations thereof, and $R^3{}_2O_5$ with a proportion of between 0 mole % and 6 mole %, wherein $R^3$ is Nb and/or Ta.

The above-stated proportions indicate the oxidic composition of the matrix material. However, oxides are not mandatory additions as starting materials, instead hydroxide, carbonate, nitrate, etc., if existing, can also be used in the glass components and thus be present in the mixture.

Pursuant to at least one embodiment, at least one phosphor or combinations of a plurality of phosphors are embedded in the matrix material. The phosphor or phosphors can, for example, be embedded in the matrix material in powder form.

In various embodiments tellurium oxide can have the chemical compositions tellurium (IV) oxide ($TeO_2$), tellurium (IV, VI) oxide ($Te_2O_5$) and/or tellurium (VI) oxide ($TeO_3$). In particular, the tellurium oxide is tetrahydric or hexahydric.

Pursuant to at least one embodiment, the proportion of tellurium oxide is 67 mole %, 68 mole %, 70 mole %, 72 mole % or 75 mole %, 77 mole % as a minimum and/or 80 mole %, 82 mole %, 85 mole % or 87 mole % as a maximum.

Pursuant to at least one embodiment, $TeO_2$ is used as tellurium oxide. $TeO_2$ has a proportion of between 67 mole % as a minimum and 68 mole % as a maximum inclusively. In particular, the proportion of tellurium oxide is 68.5 mole %. The inventors have recognized that a glass composition as matrix material with such a proportion of tellurium oxide has particularly advantageous properties, such as crystallization stability, sinterability at temperatures less than 400° C. and low softening and glass transition temperatures, a high transmission as well as a high refractive index. The matrix material is thus extremely suitable for use in optoelectronic components. However, the proportion of between 67% mole % as a minimum and 69 mole % as a maximum inclusively for tellurium oxide does not necessarily have to be selected. A proportion of tellurium oxide in the range of 65 mole % to 90 mole % can also be used.

Alternatively or additionally, the glass composition can also have an alkaline earth oxide and/or zinc oxide and/or manganese oxide as $R^1O$. In particular, the proportion of $R^1O$ is 10 mole %, 12 mole % or 14 mole % as a minimum and/or 16 mole %, 18 mole % or 18.5 mole % as a maximum.

Combinations of magnesium, calcium, strontium, barium, manganese and zinc with regard to $R^1O$ here and in the following mean that at least two components, for example, magnesium and calcium or zinc and barium, or even three components can coexist as oxides in the glass composition.

Pursuant to at least one embodiment, $R^1O$ is zinc oxide and/or barium oxide.

The glass composition as matrix material comprises alkaline oxide ($M^1{}_2O$). In particular, the proportion equals 4 mole %, 6 mole %, 8 mole %, 10 mole % or 12 mole % as a minimum and/or 14 mole %, 16 mole %, 18 mole %, 20 mole %, 22 mole % or 24 mole % as a maximum. For example, the proportion of $M^1{}_2O$ equals between 10 mole % and 12 mole % (limits included).

Lithium oxide ($Li_2O$), sodium oxide ($Na_2O$) or potassium oxide ($K_2O$) as well as combinations of the three stated oxides can be used for producing the glass composition or in the glass composition.

The predominant task of the alkaline oxides is to reduce the viscosity of the matrix material, which in turn is advantageous in order to embed temperature-sensitive materials in the matrix material at low temperatures. In particular, lithium oxide and/or sodium oxide ($Li_2O$ and $Na_2O$) are used, as the latter reduce the softening temperature the most, but lower the chemical stability to a lesser extent than, for example, potassium oxide ($K_2O$).

The glass composition furthermore has oxides of trivalent metals, such as aluminum, gallium, indium, bismuth, scandium, yttrium, lanthanum, rare earths and combinations thereof ($R^2{}_2O_3$). In particular, oxides of aluminum, lanthanum, bismuth, yttrium and/or rare earths are preferred.

Rare earths here designate the chemical elements in the $3^{rd}$ sub-group of the periodic system (with the exception of actinium) and the lanthanides.

Pursuant to at least one embodiment, the proportion of $R^2{}_2O_3$ is 1.2 mole %, 1.4 mole %, 1.5 mole % or 1.75 mole % as a minimum and/or 1.9 mole %, 2 mole %, 2.4 mole % or 2.6 mole % as a maximum, for example, 1.7 mole %. In particular, the proportion of $R^2{}_2O_3$ in the glass composition should not be greater than 3 mole %, as this can have a detrimental effect on the properties of the glass composition. A proportion of $R^2_2O_3$ greater than 3 mole % can raise the transformation, sinter and/or softening temperatures.

The components for the glass composition can be selected from the oxides of trivalent metals but also from hydroxides, carbonates, nitrates, etc., if existing, from trivalent metals. However, preferably selected are non-coloring or selectively coloring (filter) compounds, such as aluminum oxide, lanthanum oxide, bismuth oxide, yttrium oxide and/or oxides of rare earths.

The presence of $R^2_2O_3$ in the matrix material, in particular in the glass composition surprisingly has a considerable effect on the crystallization tendency. For instance, the addition of $R^2_2O_3$ can prevent the crystallization of the glass composition during usage in optoelectronic components, for example. Matrix material demonstrating no light scattering in a broad spectral range of 380 nm to 800 nm can thus be provided for a conversion element.

Alternatively or additionally, the glass composition can comprise at least titanium dioxide, zirconium dioxide, hafnium dioxide or combinations of such oxides as $M^2O_2$. In particular, the proportion of $M^2O_2$ is between 1 and 1.5 mole %, for example, 1.3 mole %.

Alternatively or additionally, the glass composition can comprise niobium oxide and/or tantalum oxide ($R^3_2O_5$). Niobium oxide can be used in the form of niobium (II) oxide (NbO), niobium (IV) oxide (NbO$_2$) and/or niobium (V) oxide (Nb$_2$O$_5$). Tantalum oxide can be used in the form of tantalum (II) oxide (TaO), tantalum (IV) oxide (TaO$_2$) and/or tantalum (V) oxide (Ta$_2$O$_5$). Niobium oxide or tantalum oxide can increase the chemical stability of the glass composition but also to a lesser extent the viscosity.

Pursuant to at least one embodiment, the proportion of niobium oxide and/or tantalum oxide is 1 mole %, 2 mole % or 3 mole % as a minimum and/or 4 mole % or 5 mole % as a maximum.

Pursuant to at least one embodiment, the glass composition consists of tellurium oxide, $M^1_2O$, $R^1O$ and $R^2_2O_3$, wherein $R^2_2O_3$ has a proportion of between 1.5 mole % and 2 mole %.

The inventors have recognized that the components of the matrix material, in particular of the glass composition, reduce the crystallization tendency, without simultaneously substantially increasing the glass transformation and softening temperatures. In particular, aluminum oxide, lanthanum oxide, bismuth oxide, yttrium oxide and/or rare earths are responsible for reducing the crystallization tendency.

Glass transformation temperature or glass transition temperature ($T_g$) is the temperature at which a glass or the glass composition is converted from the brittle elastic into the viscoelastic range. The measurement of the glass transition temperature can ensue, inter alia, with the aid of a dilatometer (TMA=thermomechanical analysis) or the differential scanning calorimetry (DSC) or the differential thermal analysis (DTA).

Softening temperature ($T_e$) is the temperature at which the glass or glass composition begins to noticeably deform and thus change shape under the influence of the deadweight. The softening temperature is a significant parameter when embedding materials, for example, a phosphor, in glass. In such processes the glass must be heated to a temperature greater than the softening temperature and significantly flow, in order to create a solid connection between the materials to be embedded. If such materials are temperature-sensitive, a softening temperature that is as low as possible is required for the embedding process. The softening temperature can be determined by means of differential scanning calorimetry (DSC) or dilatometry (TMA) or a viscosity measurement.

The crystallization of the glass composition or a lacking crystallization of the glass composition can be determined by means of x-ray diffraction (XRD).

Pursuant to at least one embodiment, the glass composition is free of boron trioxide, germanium oxide, phosphates, halides, $P_2O_5$ and $SiO_2$. "Free from" here and in the following means that the glass composition contains no or very low proportions in the ppm range, for example, a proportion of $10^{-4}$ ppm of the stated compounds as a maximum in the glass composition.

The disadvantage of boron trioxide and, for example, phosphorous pentoxide is that they have only a low chemical stability. They are thus unsuitable for many usages due to the lack of corrosion-resistance.

A matrix material containing boron trioxide and/or germanium oxide disadvantageously tends towards crystallization due to a separation behavior, which can cause the matrix material to have scattering or absorbent properties.

Pursuant to at least one embodiment, the glass composition is RoHS compliant (restriction of certain hazardous substances) and free of lead, arsenic, cadmium, uranium and thorium. In particular, the conversion element is RoHS-compliant and free of lead, arsenic, cadmium, uranium and thorium.

Pursuant to at least one embodiment, the glass transformation temperature of the matrix material, in particular of the glass composition, has a value of less than 320° C., in particular less than or equal to 295° C.

Pursuant to at least one embodiment, the dilatometric softening temperature of the matrix material has a value of less than 400° C., in particular less than 350° C. or less than 325° C.

Pursuant to at least one embodiment, the matrix material is radiolucent and/or free of scattering. This means in particular that 90%, less the Fresnel losses >95%, ideally >99% of the incidental electromagnetic radiation is transmitted from a wavelength range of 380 nm to 800 nm. The matrix material, in particular the glass composition, has in particular the property of demonstrating high transmission and low absorption. In particular, the matrix material absorbs <10%, preferably <5%, more preferably <1% of the incidental electromagnetic radiation from a wavelength range of 380 nm to 800 nm. The Fresnel losses can equal 8-11% per limiting surface, depending on the refractive index.

Pursuant to at least one embodiment, the matrix material is colorless. "Colorless" here and in the following designates that the matrix material, in particular the glass composition, absorbs no electromagnetic radiation, i.e. 5% as a maximum of the incidental electromagnetic radiation from a wavelength range of 380 nm to 800 nm. The exception here is a component in the matrix material that causes a filter effect or enables a secondary radiation to be emitted after being excited by primary radiation. The latter applies particularly to rare earths, which cause fluorescent glasses.

In addition, the matrix material demonstrates an advantageous highly refractive property. For example, the refractive index is dependent on the content of tellurium oxide in the glass composition or in the glass. In particular, the matrix material has a refractive index of $n \geq 1.8$, in particular $n \geq 2$.

Pursuant to at least one embodiment, the matrix material comprises a further component, which increases the refractive index of the matrix material. For example, refractive-index-increasing compounds known to a person skilled in the art, such as $La_2O_3$, can be added to the matrix material.

Pursuant to at least one embodiment, the matrix material comprises a further additional component with radiation-absorbing properties. The further additional component advantageously absorbs radiation in the wavelength range of ≤380 nm, preferably in a wavelength range of ≤400 nm. In particular, the further additional component absorbs >20%, preferably >40%, more preferably >60% of the radiation in the stated wavelength range. The matrix material can thus additionally serve as UV filter.

Pursuant to at least one embodiment, the matrix material, in particular the glass composition, is an ultra-low melting material. Any material that softens at a temperature of 350° C. as a maximum is viewed as ultra-low melting material within the scope of the present application, as this advantageously enables the matrix material to be directly connected with the semiconductor chip at low temperatures of 350° C. as a maximum, wherein the semiconductor chip suffers no damage at such temperatures.

Here and in the following, any substance is designated as "phosphor" that at least partially absorbs electromagnetic primary radiation and is emitted as electromagnetic secondary radiation in at least partially different wavelength range to the electromagnetic primary radiation.

Electromagnetic primary radiation and/or electromagnetic secondary radiation can comprise one or more wavelengths and/or wavelength ranges in an infrared to ultraviolet wavelength range, in particular in a wavelength range between approximately 185 nm and 800 nm, preferably approximately 350 nm and 800 nm. The spectrum of the electromagnetic primary radiation and/or the spectrum of the electromagnetic secondary radiation can thereby be narrow-banded, i.e. the electromagnetic primary radiation and/or the electromagnetic secondary radiation can have a monochrome or almost monochrome wavelength range. Alternatively, the spectrum of the electromagnetic primary radiation and/or the spectrum of the electromagnetic secondary radiation can also be broad-banded, i.e. the electromagnetic primary radiation and/or the electromagnetic secondary radiation can have a mixed-color wavelength range, wherein the mixed-color wavelength range can have a continuous spectrum or a plurality of discreet spectral components in various wavelengths in each case.

A garnet phosphor, for example, a yellow garnet phosphor, can be used as phosphor. Alternatively or additionally, a nitridic phosphor, for example, a red-emitting nitridic phosphor, can be used. In principle, however, all phosphors are suitable, including aluminates, orthosilicates, sulphides or Calsine, for example.

Pursuant to a further embodiment, the embedding of the phosphor in the matrix material can be homogenous. Alternatively, the phosphor can be distributed in the matrix material with a concentration gradient.

The matrix material demonstrates higher heat conductivity than conventionally used silicone, thus advantageously improving the heat dissipation of the heat generated in operation by means of the matrix material. This allows the heat generated during operation, in particular the heating of the phosphor generated by the Stokes shift during operation, to be efficiently dissipated in the conversion element via the matrix material, thus advantageously increasing the efficiency of the phosphor and, by implication, the efficiency of the component. This also applies predominantly to laser applications, in which the conversion element is applied to a vitreous, ceramic or metallic substrate and is spaced apart from the semiconductor chip, as well as to high-performance chips.

Pursuant to a further embodiment, the phosphor can be embedded in the matrix material and be designed as a casting compound, layer or film. The casting compound can, for example, be integrally connected with a semiconductor chip.

Pursuant to a further embodiment, the matrix material can also comprise a filling material, such as a metal oxide, for example, such as titanium dioxide, silicon dioxide, zirconium dioxide, zinc oxide, aluminum oxide and/or glass particles. The filling material can, for example, be used for specifically scattering light and be non-homogeneously or homogeneously distributed in the matrix material.

Furthermore, a method for producing a component and a component are provided. The component comprises the conversion element. The same definitions and comments apply to the method and the component as stated above for the conversion element and vice versa.

Pursuant to at least one embodiment, the component comprises a semiconductor chip. Said semiconductor chip is set up for generating electromagnetic primary radiation at least from the blue spectral range. The conversion element can be directly arranged on the semiconductor chip. Thus, no interval between semiconductor chip and conversion element is provided. Said conversion element is preferably secured on the radiation exit surface of the semiconductor chip. The conversion element is thus directly secured on the radiation exit surface of the semiconductor chip, wherein no interval and/or other layers or materials are arranged between the conversion element and the semiconductor chip. The conversion of the electromagnetic primary radiation into electromagnetic secondary radiation can thus at least partially ensue near to the radiation source, i.e. near to the semiconductor chip, for example, at a conversion element and semiconductor chip interval of less than or equal to 200 μm, preferably less than or equal to 50 μm (so-called chip level conversion).

Pursuant to at least one embodiment, the semiconductor chip comprises a semiconductor layer sequence. Said semiconductor layer sequence of the semiconductor chip is preferably based on a V-IV compound semiconductor material. The semiconductor material is preferably a nitride compound semiconductor material such as $Al_nIn_{1-n-m}Ga_mN$ or even a phosphide compound semiconductor material such as $Al_nIn_{1-n-m}Ga_mP$, wherein $0 \leq n \leq 1$, $0 \leq m \leq 1$ and $n+m \leq 1$ in each case. The semiconductor material can also be $Al_xGa_{1-x}As$ with $0 \leq x \leq 1$. The semiconductor layer sequence can have doping substances as well as additional components. However, for the sake of simplicity, only the essential components of the crystal lattice of the semiconductor layer sequence, i.e. Al, As, Ga, In, N or P are stated, even though the latter can be replaced and/or supplemented by small quantities of further substances.

The semiconductor chip can contain an active layer with at least one pn junction and/or with one or more quantum well structures. An electromagnetic primary radiation is generated in the active layer during the semiconductor chip operation. One wavelength of the electromagnetic primary radiation is preferably located in the ultraviolet and/or visible spectral range, in particular for wavelengths of between 420 nm and 680 nm inclusively, for example, between 440 nm and 480 nm inclusively.

Pursuant to at least one embodiment, a high-performance chip and/or laser can be used as semiconductor chip. The high-performance chip and/or laser can have an optical performance of 3 watts as a minimum, in particular greater than or equal to 15 watts and/or 30 watts as a maximum.

Alternatively, the semiconductor chip can also be a ceramic, vitreous or metallic substrate on which the conversion element is attached or therewith connected, e.g. for laser applications or remote phosphor. The semiconductor chip and/or the substrate can also have functional oxidic coatings that, for example, act as passivation, as protective layer or as optical element. Such coatings can be designed as layers and/or stacked layers. They can be amorphous, crystalline or semi-crystalline and be connected with the vitreous conversion element.

Pursuant to at least one embodiment, the component comprises a semiconductor chip. Said semiconductor chip is set up for generating electromagnetic primary radiation at least from the blue spectral range. The conversion element can be arranged in a spatially separated manner from the semiconductor chip. An intermediate chamber is preferably formed between the conversion element and the radiation exit surface. Said intermediate chamber can have a gas, for example, air. Thus, the conversion of the electromagnetic primary radiation into the electromagnetic secondary radiation can at least partially ensue at a large interval from the semiconductor chip. For example, the interval between conversion element and semiconductor chip can be greater than or equal to 200 µm, preferably greater than or equal to 750 µm, more preferably greater than or equal to 900 µm (so-called remote phosphor conversion).

Pursuant to at least one embodiment, the component comprises a semiconductor chip, which is set up for generating electromagnetic primary radiation at least from the blue spectral range. Alternatively, the component can comprise a substrate. The conversion element can connect an additional layer with the semiconductor chip or the substrate, wherein the additional layer is a ceramic conversion element.

The method for producing a component comprises the following steps: Providing at least one semiconductor chip, having a radiation exit surface or providing a substrate; Attaching a conversion element, as described above, on the radiation exit surface or on the substrate, and Heating the component to a maximum of 400° C., subject to weight application if need be, and therefore a connection is created between the radiation exit surface or the substrate and the conversion element.

Pursuant to at least one embodiment, the matrix material can be ground after the melt and before step b) and sieved to a specific grain size fraction. The phosphor, which is, for example, present in powder form, can subsequently be embedded in the matrix material. In the further step c) the component can be heated to 400° C. as a maximum, for example, 350° C., subject to vacuum and/or weight application, if need be. This leads to a sintering of the conversion element, in particular of the glass composition or of the glass powder particles and the embedded phosphor particles. In addition, the conversion element can be connected to the radiation exit surface, thus generating a strong connection of the conversion element to the radiation exit surface. The connection can be increased by a weight application or, as a result, even ensue at lower temperatures. In particular, the oxides of $R_2^2O_3$, such as aluminum, for example, positively influence the crystallization of the matrix material during production, and therefore the conversion element is not crystallized in step c).

It is disadvantageous for many applications, in particular in the optical technology, when a crystallization starts up during the compression of the conversion element, as light scattering can then be observed or occur on the crystals. A certain scattering may improve the light outcoupling, but this property is undefined here, as the crystallization is dependent on the procedural parameters and is almost impossible to reproduce and control. Pursuant to one embodiment, the matrix material has no crystallization after compression.

Pursuant to at least one embodiment, the conversion element is attached to the radiation exit surface as powder or as prefabricated body. "Prefabricated bodies" in this context means that the conversion element can be assembled on the radiation exit surface of the semiconductor chip in a pick-and-place process. The prefabricated body can be produced in that the glass in the mixture is initially melted. The phosphor, preferably a temperature-sensitive phosphor, such as a garnet, for example, can be embedded in this glass melt. Said glass melt is poured out or shaped and then cooled down, and therefore a solid body is created, wherein the prefabricated bodies with embedded phosphor result. Alternatively, the solid body can also be a raw form or pre-form, from which the prefabricated body with the appropriate dimensions can then be obtained, for example, by sawing, grinding, polishing, etching or laser processing. Alternatively, the phosphor and glass powder can be made into a pressed part, which can then be sintered or melted down at an increased temperature, thus causing the phosphor to be enclosed by the glass and then be present as prefabricated conversion element.

Alternatively, the prefabricated body can initially be produced without phosphor. To this end, a glass melt can initially be produced. The resulting melt can be poured out or shaped and then cooled down, thus creating a solid body. Alternatively, the solid body can also be a raw form or pre-form, from which the prefabricated body with the appropriate dimensions can then be obtained, for example, by sawing, grinding, polishing, etching or laser processing. Subsequently, the prefabricated body can be attached to the radiation exit surface or to a substrate and coated with the phosphor. The coating can, for example, ensue by printing, screen printing, spraying, knife-coating, dispensing or spin-coating. The component can subsequently be treated at a temperature of ≤350° C. for 30 minutes, for example. This causes the phosphor to sink into the glass composition and the conversion element is firmly connected with the semiconductor chip via the matrix material. This can additionally ensue with a weight application, in order to enable more phosphor to be introduced into the matrix material and/or thus enable work at a lower temperature as a result and/or to shorten the process and/or to specifically shape the conversion element. The phosphor is preferably located on the side near to the chip. This allows a conversion element, as described above, to be generated. In addition, a further conversion element, for example, a ceramic conversion element of the same or a different color or a conversion element with phosphor embedded in the glass or a lens, can also be attached to the conversion element, wherein when treating the component at a temperature of ≤350° C. the further conversion element or the lens can also be connected with the conversion element via the matrix material.

Here and in the following, color specifications with regard to the conversion element designate the respective spectral range of the electromagnetic radiation, or of the electromagnetic secondary radiation.

Pursuant to at least one embodiment, the phosphor is introduced into the glass composition before the sintering process. Introduced can, for example, mean by mixing phosphor particles and powder of the glass composition.

Pursuant to at least one embodiment, the conversion element is produced by means of a sintering process, wherein a mixture of phosphor and powder in the glass composition is hereby sintered, in particular pressed, in order to minimize air inclusions. Temperatures near to the softening point of the glass composition are hereby applied, subject to negative pressure and/or weight application, if need be.

Pursuant to at least one embodiment, a liquid melt of the glass composition with phosphor suspended therein is produced, wherein the liquid melt is subsequently sprayed or dropped in such a way that the conversion element is attached to the radiation exit surface of the semiconductor chip or of the substrate.

Pursuant to at least one embodiment, a layer of a defined layer thickness made of phosphor and optional further elements can be attached to a layer of the glass composition, wherein the glass composition is subsequently sintered at a temperature near to the softening point of the glass composition. This can cause the phosphor to sink in the glass composition and thus generate the conversion element.

Pursuant to at least one embodiment, a phosphor layer made of phosphor particles is attached to the radiation exit surface of the semiconductor chip or to the substrate, wherein the glass composition is subsequently removed from the gas phase and deposited in the intermediate chambers between the phosphor particles.

Pursuant to at least one embodiment, a phosphor layer made of phosphor particles is attached to the radiation exit surface of the semiconductor, wherein the prefabricated glass platelet is subsequently attached and softened during a temperature treatment, or subject to weight application, if need be, and flows into the intermediate chambers between the phosphor particles (sinking on of the glass) and thus firmly connects the conversion element with the radiation exit surface of the semiconductor.

Pursuant to at least one embodiment, a vitreous layer of the glass composition is generated on a substrate, for example, thin flat glass, transparent ceramic or glass ceramic. A phosphor layer is subsequently attached which then sinks subject to temperature increase in the vitreous layer. This can additionally ensue with weight application, in order to enable more phosphor to be introduced into the matrix material and/or to thus enable such phosphor to sink in at a low temperature and/or to shorten the process time. Alternatively, glass powder and phosphor powder can also be mixed and then attached as layer on the substrate. Furthermore, scattering particles can be used in both cases, which homogenize the radiation emission characteristic and/or increase the light outcoupling.

Pursuant to at least one embodiment, the conversion element is a separate platelet as prefabricated body. Said platelet is attached to the radiation exit surface of the semiconductor chip. In particular, the matrix material is produced as thin layer directly on the semiconductor chip or as separate platelet at higher temperatures of above 350° C. Alternatively or additionally, the matrix material can be directly attached as thin film to a substrate, a further conversion element or a lens. At such temperature above the dilatometric softening temperature the glass preferably has a viscosity of $\eta$ with $10^{7.6}$ dPas*s$\geq\eta\geq 10^{-2}$ dPas*s, in particular of $10^4$ dPas*s$\geq\eta\geq 10^{-2}$ dPas*s, ideally of $10^2$ dPas*s$\geq\eta\geq 10^{-2}$ dPas*s, which generates a very compact and relatively bubble-free glass layer. This is subsequently coated with phosphor, for example, YAG:Ce, by means of the method known to a person skilled in the art. The phosphor particles subsequently sink into the glass layer, for example, within 1, 5, 10 or 30 minutes, at a temperature of less than or equal to 350° C. That means that the glass composition coated with the phosphor is then heated to the extent that the glass is only slightly softened and the phosphor sinks into the glass layer and is surrounded by said glass layer. This can also ensue subject to weight application, in order to introduce more phosphor into the matrix material or glass and/or lower the process temperature and/or shorten the process time.

In the event of a separate platelet, the platelet may be positioned on the semiconductor chip before sinking and thus simultaneously bond with the chip during the sinking process. The radiation exit surface as well as the lateral surfaces can be coated with the same phosphor as well as with other phosphor types. Alternatively, both radiation exit surfaces can be coated with phosphor, wherein the same or different phosphors can be used on the two surfaces. The latter case (separation of the phosphors) allows the remission losses to be reduced (compared with the mixture within one layer).

The phosphor can also be specifically applied non-homogeneously for the sinking process, in order, for example, to improve the color location homogeneity of the component via the radiation emitting angle. Alternatively, scattering particles can also be introduced as well. The latter can be designed as a separate layer and, for example, be present on the opposing radiation exit surface. The phosphor-containing radiation exit surface is preferably near to the chip. Alternatively, the phosphor can also be completely replaced by scattering particles, in order to reflect the primary radiation as is, for example, the norm in the event of a color wheel for laser applications. It is also possible to attach various phosphors separately or combined with each other. The latter usually coexist separately from each other on a substrate in the event of a color wheel for laser applications. In a particular embodiment a reflecting and converting layer can also be arranged on top of one another on a substrate, and therefore both non-converted primary radiation and secondary radiation are reflected by the substrate. In remote applications the reflecting layer is preferably near to the substrate and remote from the converting substrate. The reflectivity of the reflecting layer in such case equals >80%, preferably >90%, in particular ≥95% of the impinging radiation, i.e. the total of secondary and, if need be, primary radiation.

BRIEF DESCRIPTION OF THE DRAWINGS

A glass composition, a component as well as a method for producing a component are described in more detail in the following with reference to the drawing on the basis of embodiments. Identical reference signs indicate identical elements in the individual illustrations. However, no true-to-scale references are made. Instead, individual elements can be shown in an exaggeratedly large manner for the sake of better understanding.

Shown in:

FIG. 1 are embodiments A1 to A7 of a matrix material as well as comparative examples V1 to V4, FIG. 7 to 12 are a schematic side view of a component pursuant to an embodiment in each case.

DETAILED DESCRIPTION OF ILLUSTRATIVE EMBODIMENTS

FIG. 1 shows embodiments A1 to A7 of the matrix material in tabular form. The table also shows comparative examples V1 to V4 of conventional matrix materials. The values stated in the table indicate a maximum error of 5%. No phosphor is embedded in this matrix material. The matrix material of the embodiments A1 to A7 comprises tellurium oxide, in particular tellurium oxide $TeO_2$. The proportion of tellurium oxide in A1 to A7 equals between 67 mole % and 69 mole %. In particular, the proportion of tellurium oxide equals between 67.5 mole % and 68.5 mole % inclusively.

The matrix material further comprises $R^1O$ as zinc oxide. The proportion of zinc oxide equals between 18 mole % and 20 mole % inclusively.

The matrix material further comprises $M^1_2O$ in the form of disodium oxide. The proportion of disodium oxide in the matrix material equals between 10 mole % and 12 mole % inclusively.

The matrix material further comprises an oxide of a trivalent metal, such as, for example, aluminum trioxide, lanthanum trioxide, bismuth trioxide and/or yttrium trioxide. The proportion of the oxide of the trivalent metal equals between 1.5 mole % and 2.5 mole %.

Furthermore, FIG. 1 shows the glass transformation temperatures $T_g$ relating to the embodiments A1 to A7 and determined by means of dilatometry in ° C. The glass transformation temperatures equal between 283° C. and 294° C. In particular, the glass transformation temperatures of the matrix material equal <295%.

Furthermore, FIG. 1 shows the associated thermal expansion coefficients x and the softening temperatures $T_e$ of the embodiments A1 to A7 in ° C. $T_e$ equals between 308° C. and 323° C. and was determined by means of dilatometry.

Furthermore, FIG. 1 shows a refractive index n for the embodiments A2, A5 and A6 of approximately 2, which was determined at a wavelength of 546.06 nm.

The comparative examples V1 to V4 are shown in comparison. The comparative examples A1 to A7 differ from the embodiments A1 to A7 in particular due to the face that the matrix material of V1 to V4 has no oxides of trivalent metals. Accordingly, the comparative examples have higher softening temperatures $T_e$ of ≥329° C. (V2, V4) and/or a high crystallization tendency (V1, V3), in particular during production. The comparative examples are thus not very suitable in a conversion element in which temperature-sensitive phosphors are also embedded, for example.

Figure 2:
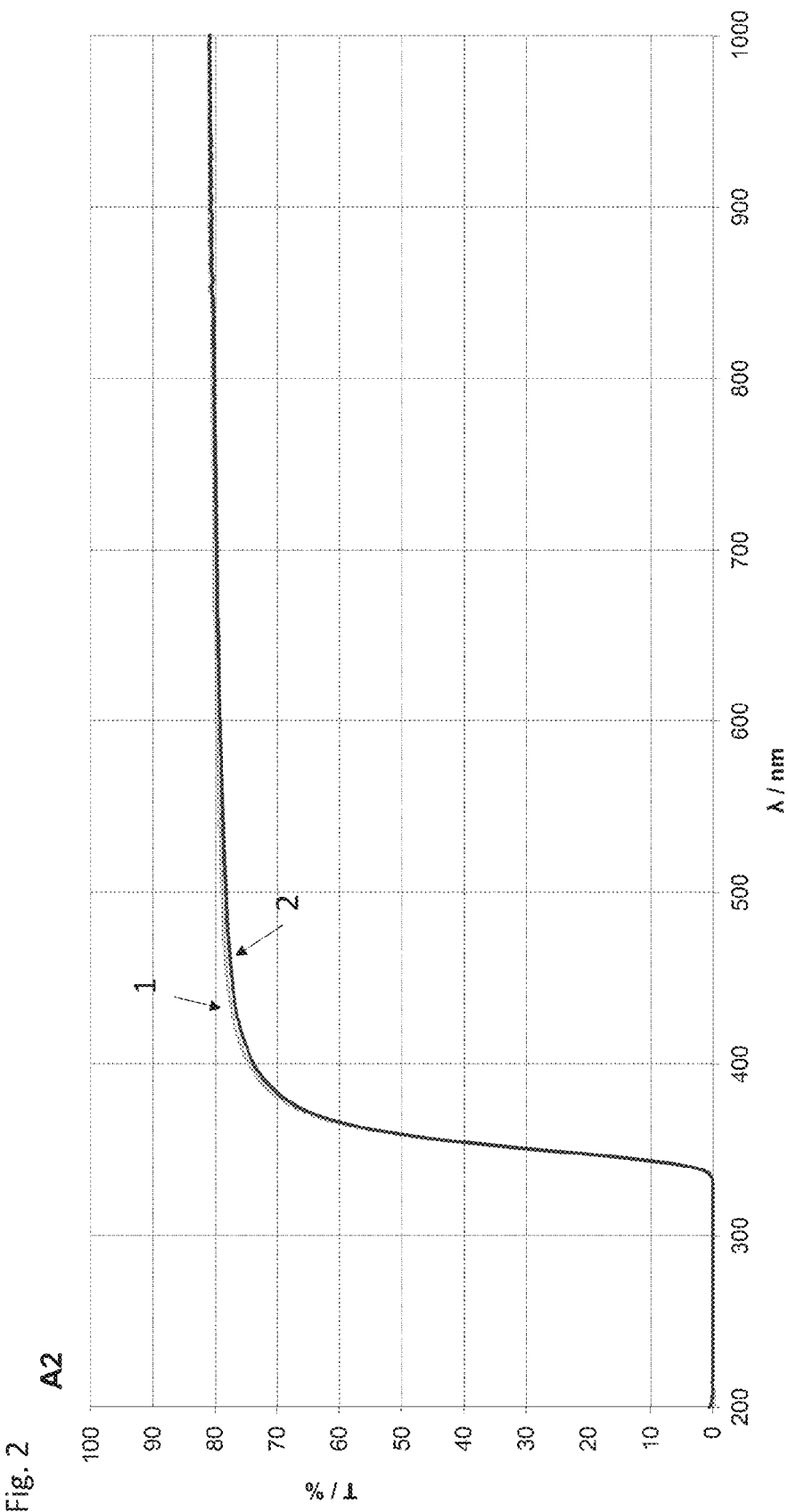
FIG. 2 is a transmission spectrum of an embodiment.

FIG. 2 shows a transmission spectrum for the embodiment A2, which is shown in the table of FIG. 1. Shown is the transmission T in % in dependency upon the wavelength λ in nm. The curve 1 shows the matrix material before a weathering test, wherein the wall thickness WD of the sample WE=0.89 nm. The curve 2 shows the transmission curve of the matrix material of A2 after conducting the weathering test. Said weathering test ensued in such a way that the matrix material was exposed to a temperature of 85° C. with a relative humidity of 85% and over 1000 hours. A comparison of the matrix material before (curve 1) and after (curve 2) the weathering test essentially shows no difference in transmission. It can thus be concluded that the matrix material did not change during the test. The material matrix of embodiment A2 is thus particularly weather-resistant and corrosion-resistant and very suitable for a conversion element.

Figure 3:
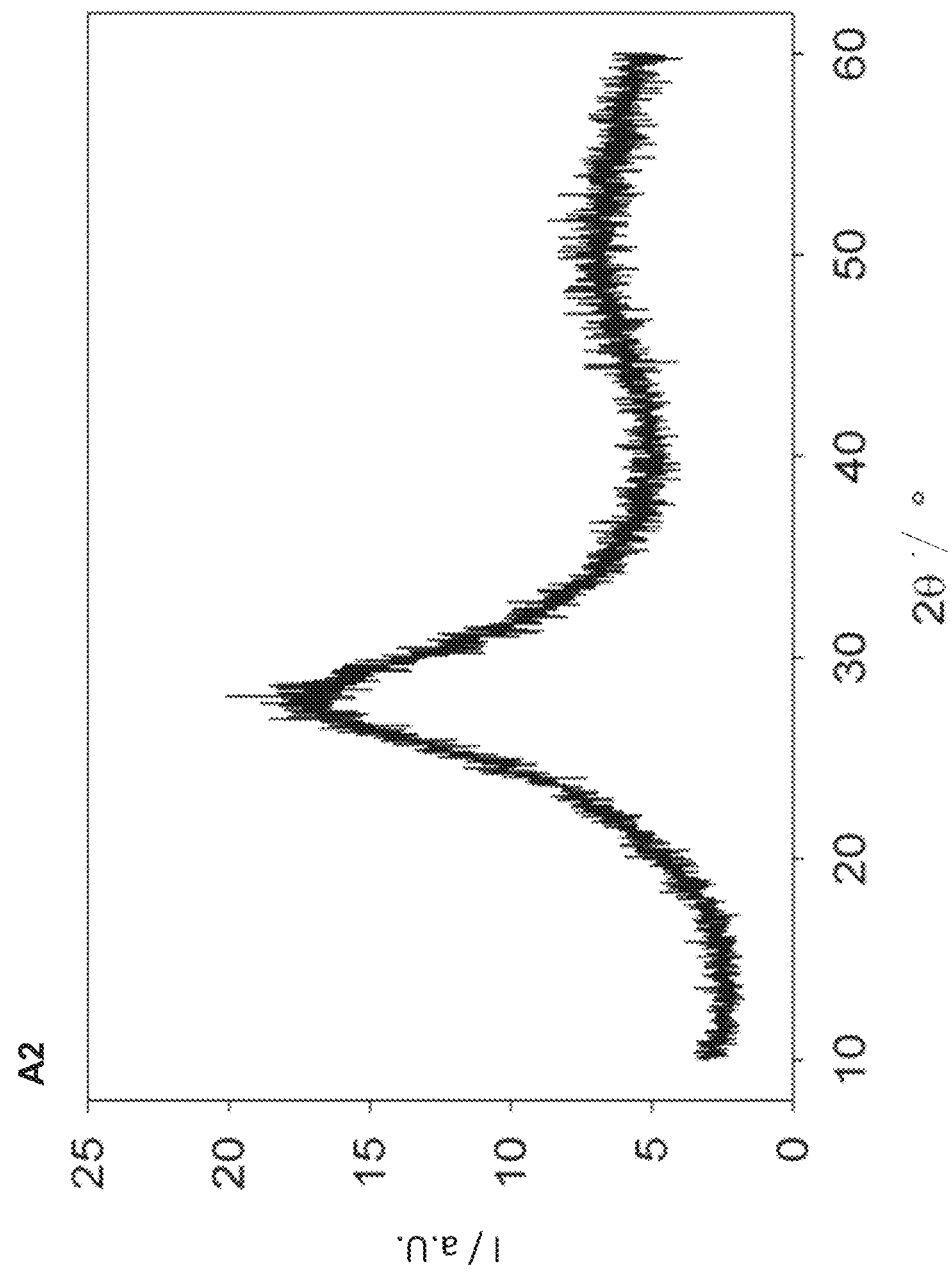
FIG. 3 is an x-ray diffraction diagram of an embodiment.

FIG. 3 shows an x-ray diffraction diagram of embodiment A2 pursuant to the table in FIG. 1. The intensity I in a.U. (arbitrary units) in dependency upon 2θ is shown in °. It is evident from the graphic that the matrix material is present in a purely amorphous and non-crystalline state. This is advantageous, as this in particular means that the matrix material scatters no electromagnetic radiation from the visible range.

Figure 4:
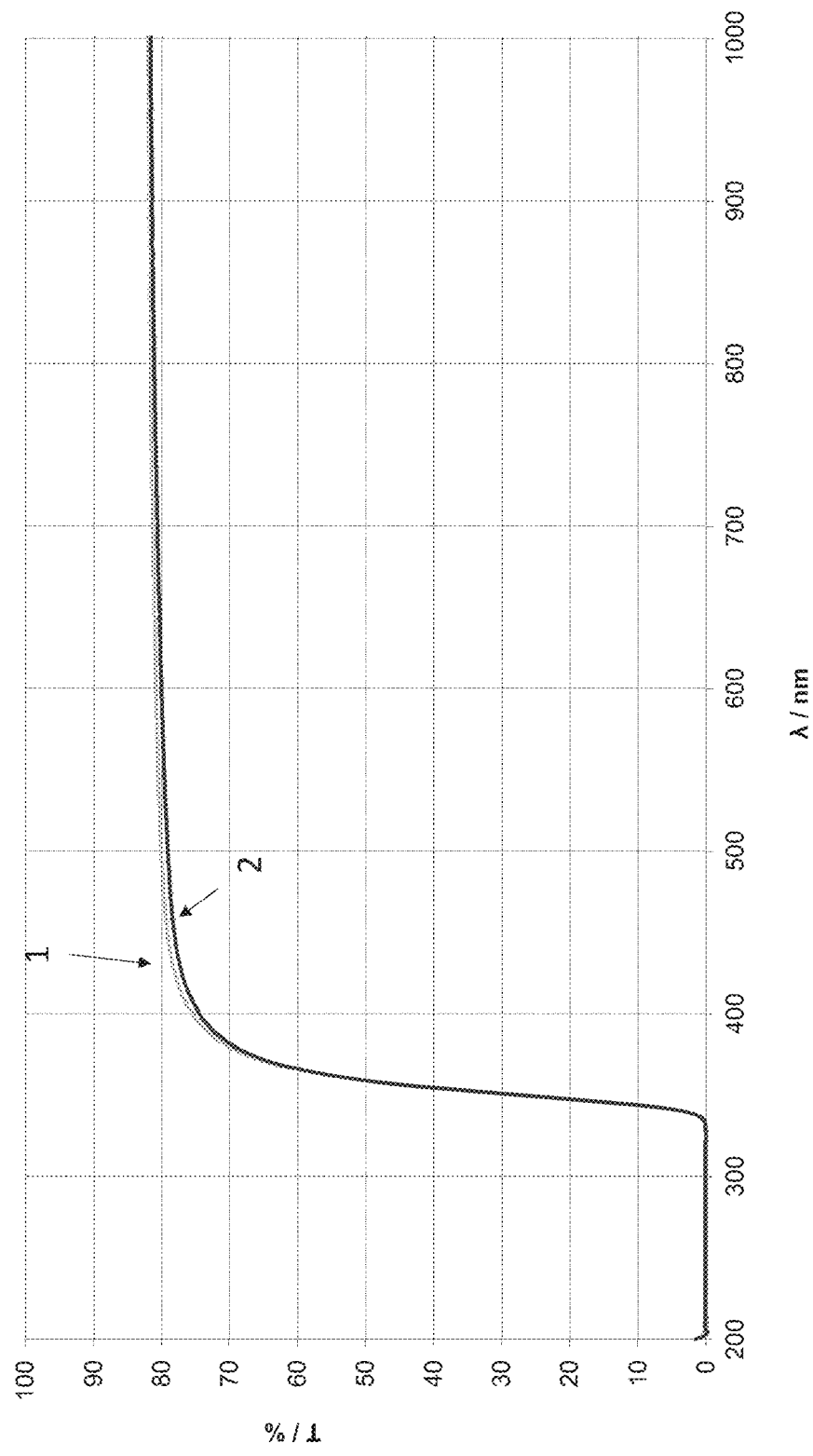
FIG. 4 is a transmission spectrum of an embodiment.

FIG. 4 shows a transmission spectrum of embodiment A6 in the table in FIG. 1. The transmission T in % in dependency upon the wavelength λ is shown in nm. The curve 1 shows the transmission of the matrix material with a wall thickness of 0.98 nm before the weathering test, the curve 2 shows the transmission of the matrix material after the weathering test. The transmission does not change due to the influence of temperature, relative humidity and over time (1000 hours) in the total wavelength range of 200 nm to 1000 nm.

Figure 5:
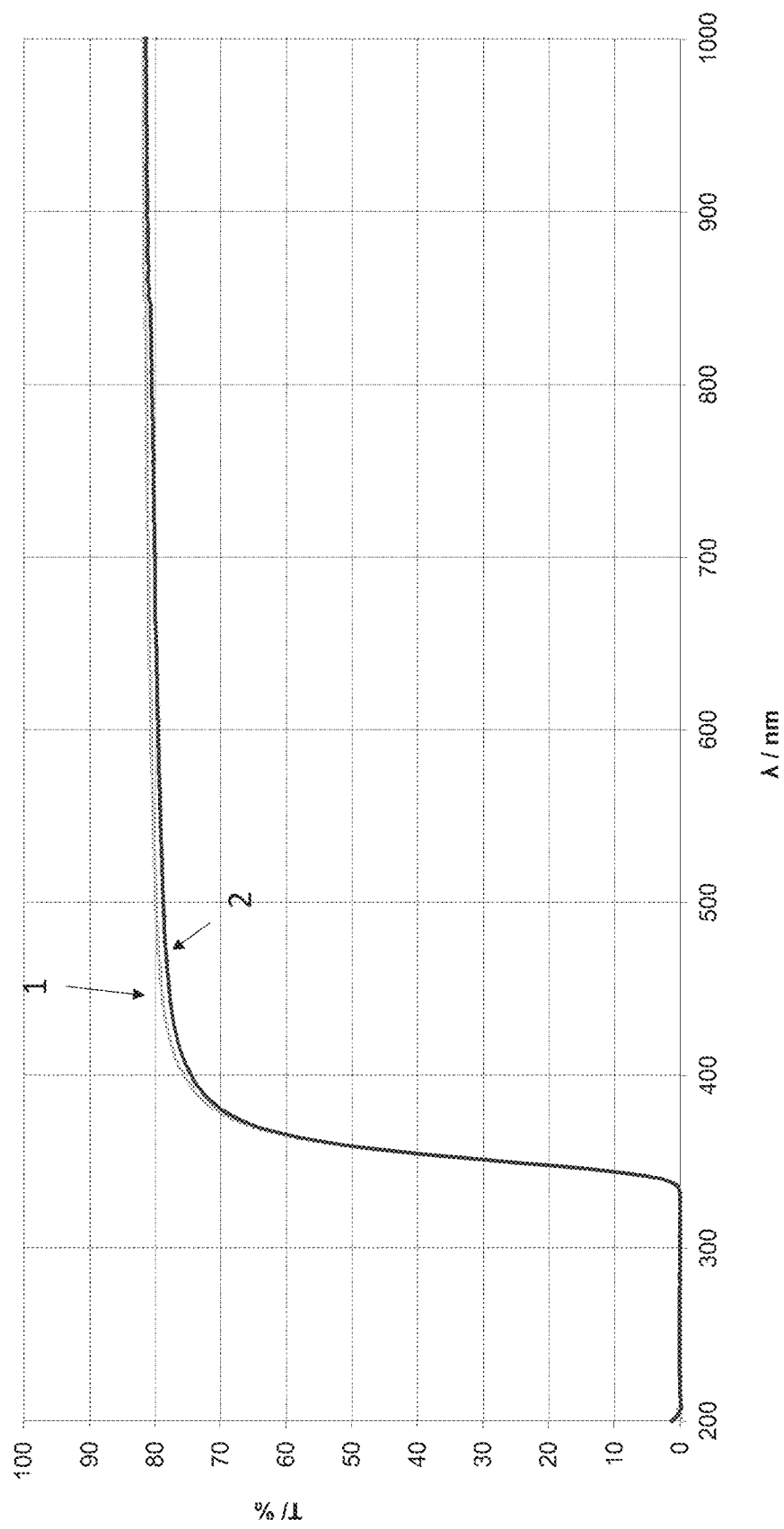
FIG. 5 is a transmission spectrum of an embodiment.

FIG. 5 shows a transmission spectrum of embodiment A7 in the table in FIG. 1. The transmission T in % in dependency upon the wavelength λ is shown in nm and measured against a wall thickness of 0.96 nm. The transmission curves are shown before (curve 1) and after (curve 2) the weathering test. A comparison of the matrix material before (curve 1) and after (curve 2) the weathering test essentially shows no difference in transmission. It can thus be concluded that the matrix material did not change during the test. The embodiment A7 is also weather-resistant.

Figure 6:
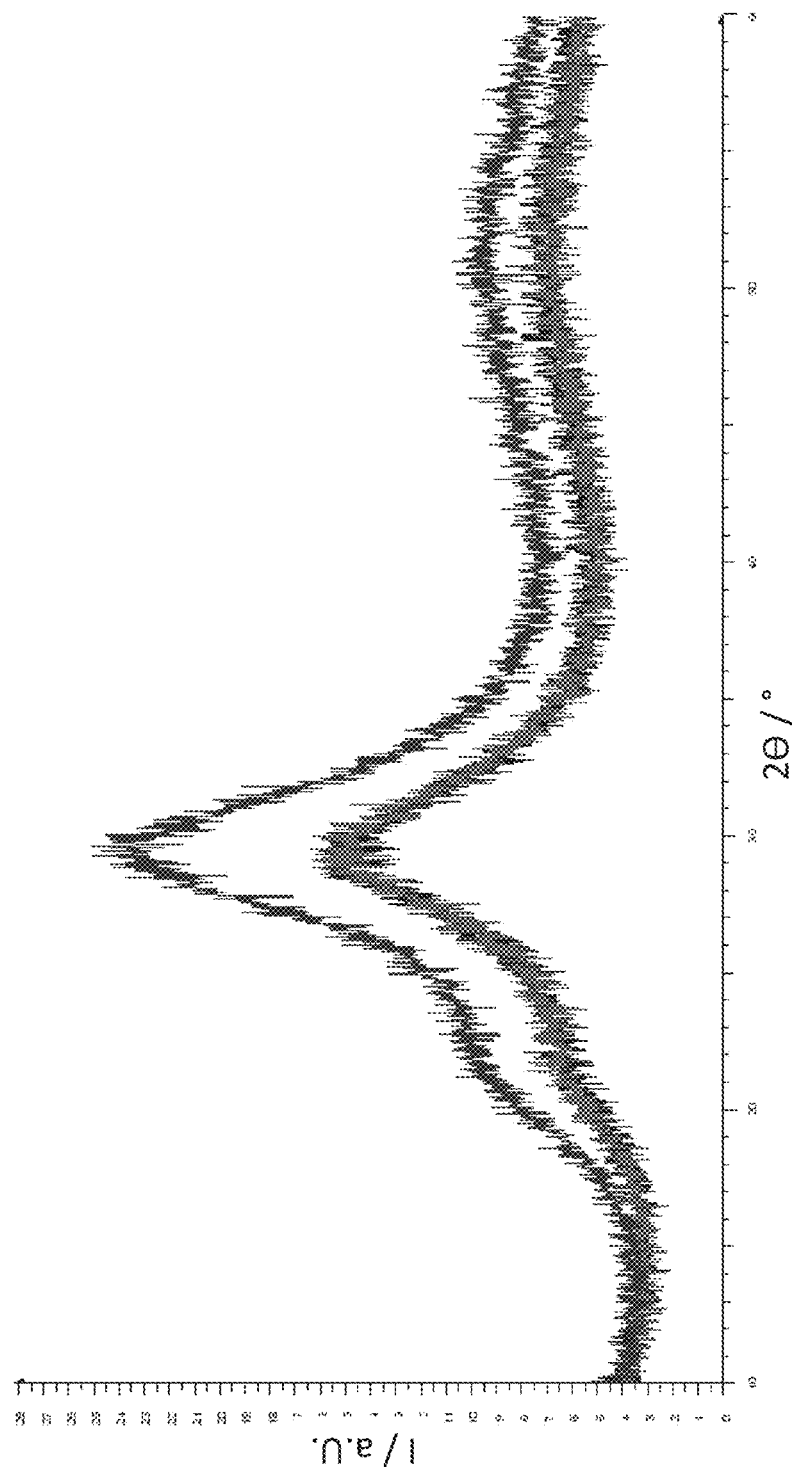
FIG. 6 is a comparison of x-ray diffraction diagrams of three embodiments.

FIG. 6 shows an x-ray diffraction diagram of embodiment A2, A5 and A6 pursuant to the table in FIG. 1. The intensity I in a.U. (arbitrary units) in dependency upon 2θ is shown in °. It is evident from the graphic that the matrix material in A2, A5 and A6 is purely amorphous and contains no crystals. This is advantageous, as this in particular means that the matrix material scatters no electromagnetic radiation from the visible range.

Figure 7:
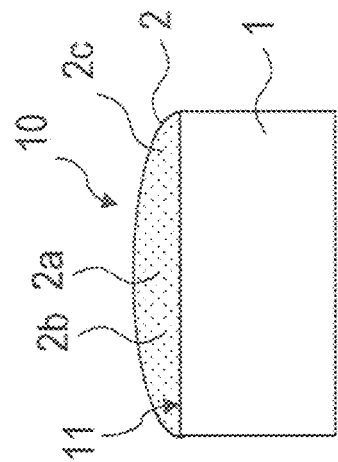

FIG. 7 shows a component 10 pursuant to an embodiment. In particular, said component 10 is an optoelectronic component. In other words, the component 10 is set up to emit electromagnetic radiation, particularly in the visible range. The component 10 has a semiconductor chip 1. A conversion element 2 is arranged in direct contact on this semiconductor chip 1. Said conversion element 2 comprises a glass composition 2a as matrix material and at least one phosphor 2b. Said phosphor 2b is set up for absorbing the primary radiation emitted by the semiconductor chip 1, wherein said primary radiation is converted at least partially into electromagnetic secondary radiation. The conversion element 2 is attached directly on the radiation exit surface 11 of the semiconductor chip 1. The glass composition 2a serves here to embed the phosphor 2b. Furthermore, the glass composition 2a demonstrates higher heat conductivity as matrix material than silicone, and therefore the heat generated in the conversion element 2 is easier to dissipate from the glass composition 2a and the phosphor suffers less damage, which increases the efficiency of the optoelectronic component. Simultaneously, the direct connection of conversion element and radiation exit surface increases the efficiency of the semiconductor chip, as the higher refractive index and the higher heat conductivity of the glass composition allow both the light outcoupling and the efficiency to be improved.

A garnet phosphor, for example, a yellow garnet phosphor, a nitridic phosphor, for example, a red-emitting nitridic phosphor, aluminates, orthosolicates, sulphides or Calsine can be used as phosphor. In principle, however, all phosphors can be used that are set up for converting electromagnetic primary radiation into electromagnetic secondary radiation.

The conversion element 2 in FIG. 7 is designed in a platelet form. The conversion element 2 preferably has a thickness of 1 μm to 200 μm, in particular between 5 μm and 100 μm, for example, 30 μm. The platelet-shaped conversion element advantageously covers at least 80% of the radiation exit surface 11 of the semiconductor chip 1. The basal area of the conversion element 2 is preferably congruent or almost congruent with the basal area of the semiconductor chip 1 in a top view of the component 10. In a particular embodiment the basal area of the conversion element 2 can also be greater than the basal area of the semiconductor chip 1.

Alternatively, a vitreous, ceramic or metallic substrate can also be used in place of the semiconductor chip 1, on which the conversion element 2 is attached and, for example, used for transmitting or reflecting laser applications. The laser can have an optical performance of 1 watt as a minimum and/or 20 watts as a maximum. The substrate can also have functional oxidic coatings that act, for example, as passivation, as protective film or as optical element. Such layers as well as layer stacks can be amorphous, crystalline or semi-crystalline and connected with the vitreous conversion element 2. In a particular embodiment the conversion element 2 can be produced on a transmitting substrate and then secured on a semiconductor chip 1. In such case, the substrate is preferably facing away from the semiconductor chip 1.

The embedding of the phosphor 2b in the glass composition 2a preferably ensues by means of a softening, sinking into, sinking onto, melting into and/or sinter process. For example, the phosphor 2b is mixed with the pulverized glass of the glass composition 2a and a paste produced therefrom, which is subsequently screen printed or dispensed onto a substrate and then vitrified. If need be, this can also ensue subject to negative pressure and/or with weight application.

Alternatively, the surface of the prefabricated body of the glass composition 2a can be coated with a phosphor 2a. The coating can, for example, ensue by printing, screen printing, spraying, knife-coating, dispensing or spin-coating. The component 10 can subsequently be treated at a temperature of ≤350° C. for 30 minutes, for example. This causes the phosphor 2b to sink into the glass composition 2a. If need be, this can ensue with weight application. This allows a conversion element 2 to be generated, which comprises the glass composition 2a as matrix material and a phosphor 2b. The conversion element 2 demonstrates high quantum efficiency (QE) of 90% as a minimum compared with a conventional conversion element containing silicone as matrix material with the same phosphor.

The following table shows the relative quantum efficiency when using the glass composition of the embodiment A8 in conjunction with a phosphor, for example, a yellow garnet phosphor or a red nitridic or a warm white mixture. A conversion element with the same phosphor powder in the silicone matrix was used as reference.

| Conversion element 2 comprising one of the following phosphors 2b and the glass composition 2a of the embodiment A8 | Relative QE/% |
| --- | --- |
| Yellow garnet phosphor | ≥90 |
| Red nitridic phosphor | ≥90 |
| Warm white mixture | ≥90 |

Figure 8:
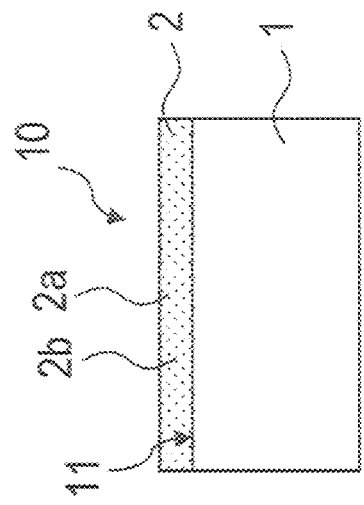

FIG. 8 shows a schematic side view of a component pursuant to an embodiment. FIG. 8 differs from the embodiment of FIG. 7 in that the conversion element is designed as beam-shaped element. In particular, the conversion element 2 has a convex lens shape. Said conversion element 2 is thus already designed as an integrated lens, wherein said lens can be created, for example, by a specific shaping or by the surface tension of the glass when heating the conversion element 2.

The primary radiation emitted by the semiconductor chip 1 can be specifically guided through a conversion element 2 designed in such a way as lens or as beam-shaped element. In particular, this allows the radiation emitting angle of the primary radiation emitted by semiconductor chip 1 to be specifically changed and/or corrected. The conversion element 2 thus influences, inter alia, the radiation emitting characteristic and the directionality as well as the color location of the radiation emitted by the component.

Furthermore, the embodiment in FIG. 8 has an additional element compared with the embodiment in FIG. 7. The additional element 2c is also embedded in the glass composition 2a. In particular, the additional element 2c is distributed homogeneously in the glass composition 2a. The additional element 2c preferably increases the refractive index of the glass composition 2a. A refractive-index-increasing additional element is, for example, $La_2O_3$. For the rest, the embodiment in FIG. 8 corresponds to the embodiment in FIG. 7. This additional element 2c can additionally or alternatively specifically influence the light scattering and thus serve to better outcouple and homogenize the light. The additional element 2c can be a scattering particle, for example, $TiO_2$, $Al_2O_3$, $SiO_2$. The scattering particles can be distributed non-homogeneously in the glass composition 2a or be designed as separate layer. Said separate layer can be arranged above or below the matrix material or the glass composition 2a. Alternatively, the specific scattering can also ensue via roughening of the surface.

Figure 9:
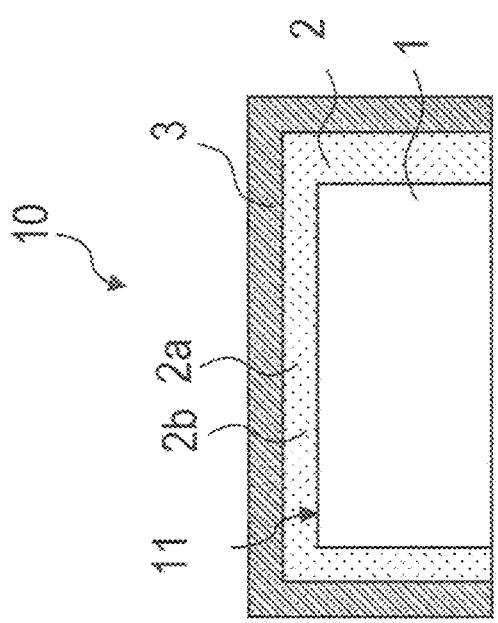

FIG. 9 shows a schematic side view of a component 10 pursuant to an embodiment. The component 10 comprises a semiconductor 1, which is completely enclosed by a conversion element 2 on the radiation exit surface 11 and on the lateral surfaces thereof. The conversion element 2 comprises a phosphor 2b and the glass composition 2a as matrix material. An additional layer 3 is directly attached to the conversion element 2. The additional layer 3 can in turn comprise a phosphor. Said phosphor of the additional layer 3 can be embedded in a matrix material. The above-described glass composition, silicone, another glass or a ceramic is suitable as a matrix material. The component 10 has two conversion layers, preferably with different phosphors. The additional layer 3 can be firmly connected with the semiconductor chip 1 via the conversion element 2. In the event of silicone, the latter cannot be attached until after the temperature treatment.

Alternatively, the additional layer 3 can be designed as casting compound (not shown here). In particular, the semiconductor chip 1 is advantageously completely enclosed by the conversion element 2 and the additional layer 3.

Figure 10:
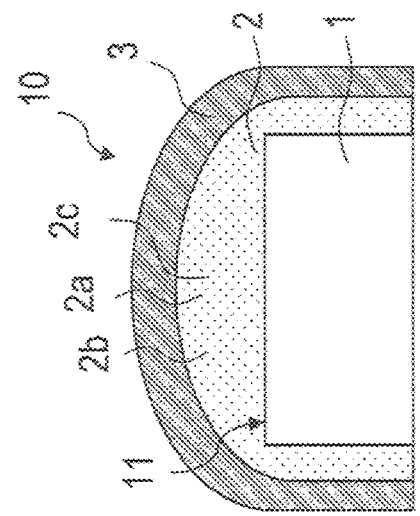

FIG. 10 shows a schematic side view of a component 10 pursuant to an embodiment. Unlike the embodiment in FIG. 9, the component 10 shows a conversion element, which is designed as a casting compound, wherein said casting compound is additionally formed as beam-shaped element. In particular, the casting compound 2 or the conversion element 2 has a convex lens shape. This allows the radiation emitting characteristic and directionality of the primary radiation emitted by the semiconductor chip 1 to be specifically changed or corrected.

The conversion element 2 further comprises a phosphor 2b, a glass composition 2a and an additional element 2c. The components embedded in the glass composition 2a, such as phosphor 2b and additional element 2c, are preferably substantially evenly distributed in the glass composition 2a.

Alternatively or additionally, the conversion element 2 can have an additional subordinate layer 3, which can comprise a component with radiation-absorbing properties. Said component preferably absorbs radiation in the wavelength range of ≤400 nm, preferably in the wavelength range of ≤380 nm. This allows organic components of the component 10, such as a plastic housing, for example, to be protected against short-wave radiation and any damage caused by implication, such as discolorations, for example.

FIG. 11 shows a schematic side view of a component 10 pursuant to an embodiment. The semiconductor chip 1 is arranged on the carrier 5. Said semiconductor chip has a subordinate conversion element 2, which comprises the glass composition 2a as matrix material and the phosphor 2b. An intermediate chamber is designed between the conversion element 2 and the semiconductor chip 1. A gas, for example, air, is preferably arranged in the intermediate chamber 8. The conversion element 2 is not directly attached to the radiation exit surface 11 of the semiconductor chip 1.

Figure 12:
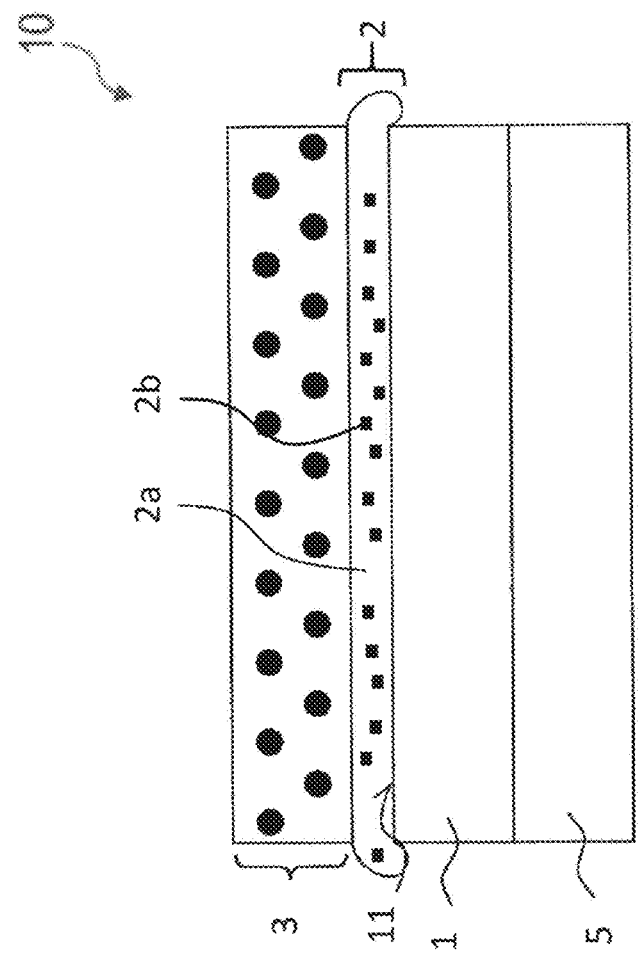

FIG. 12 shows a schematic view of a component 10, for example, of an optoelectronic component, pursuant to an embodiment. The semiconductor chip 1 is arranged on a carrier 5. A conversion layer 2 is subsequently arranged. An additional layer 3 is subordinate to the conversion layer 2. Said additional layer 3 can in turn comprise a phosphor. The additional layer 3 is in particular designed in ceramic, preferably an oxidic garnet ceramic (YAG:Ce, LuAG:Ce, etc.). The component 10 can be produced by providing a carrier 5 and attaching a semiconductor chip 1. The conversion element 2 can subsequently be attached to the radiation exit surface 11 of the semiconductor chip 1. The conversion element 2 can thereby be attached as prefabricated body, for example, as platelet, or as powder. Said prefabricated body in particular comprises at least one phosphor 2a, the color location of which preferably differs from the additional layer 3. That means that the color location of the prefabricated additional layer 3 is specifically changed by the conversion layer 2, with a red-emitting phosphor preferably being introduced. The attachment of the conversion element 2 and/or the additional layer 3 as platelet can ensue in a so-called pick-and-place process on the radiation exit surface 11 of the semiconductor layer sequence 1.

The connection of the additional layer 3 with the semiconductor chip 1 ensues via the conversion layer 2 by heating to 350° C. as a maximum, subject to weight application and/or negative pressure, if need be.

Such a structure has the advantage that ceramic conversion elements, which can only be produced in certain colors, can cover an extended color range in this way, as the phosphor 2b in the vitreous matrix material 2a, for example, also allows a warm white radiation emitting characteristic of the component to be generated.

Alternatively, a metallic, vitreous or ceramic substrate can also be used instead of the semiconductor 1. In particular, the substrate is suitable for laser applications or remote phosphor applications, for example. The substrate can also comprise functional oxidic coatings that, for example, act as passivation, protective film or as optical element. Such layers as well as layer stacks can also be amorphous, crystalline or semi-crystalline and connected with the vitreous conversion element 2.

In addition, in a further step, the ridge of the conversion element 2 is removed and/or straightened. In particular, after removing and/or straightening the ridge, the lateral sides of the additional layer 3, of the conversion element 2 and of the semiconductor chip 1 end flush.

The description on the basis of the embodiments does not limit the invention to such; instead said invention comprises every feature as well as every combination of features, which in particular includes every combination of features in the claims, even if such feature or such combination is not itself explicitly stated in the claims or embodiments.

The invention claimed is:

1. A conversion element comprising:
   a phosphor configured to convert electromagnetic primary radiation into electromagnetic secondary radiation; and
   a glass composition as matrix material in which the phosphor is embedded, wherein the glass composition has the following chemical composition:
      at least one tellurium oxide with a proportion of 65 mole % as a minimum and 90 mole % as a maximum;
      $R^1O$ with a proportion of between 0 mole % and 20 mole %, wherein $R^1$ is selected from Mg, Ca, Sr, Ba, Zn, Mn and combinations thereof;
      at least one $M^1_2O$ with a proportion of between 5 mole % and 25 mole %, wherein $M^1$ is selected from Li, Na, K and combinations thereof;
      at least one $R^2_2O_3$ with a proportion of between 1 mole % and 3 mole %, wherein $R^2$ is selected from Al, Ga, In, Bi, Sc, Y, La, rare earths and combinations thereof;
      $M^2O_2$ with a proportion of between 0 mole % and 2 mole %, wherein $M^2$ is selected from Ti, Zr, Hf and combinations thereof; and
      $R^3_2O_5$ with a proportion of between 0 mole % and 6 mole %, wherein $R^3$ is Nb and/or Ta.

2. The conversion element according to claim 1, wherein the glass composition is free of boron trioxide, germanium oxide, phosphates, halides, $P_2O_5$ and $SiO_2$, and wherein the glass composition has a glass transformation temperature of less than 320° C. and a dilatometric softening temperature of less than 400° C.

3. The conversion element according to claim 1, wherein the tellurium oxide in the glass composition is $TeO_2$ and has a proportion of 67 mole % as a minimum and of 69 mole % as a maximum.

4. The conversion element according to claim 1, wherein $R^1O$ in the glass composition has a proportion of between 14 mole % and 18 mole %.

5. The conversion element according to claim 1, wherein $M^1_2O$ in the glass composition has a proportion of between 8 mole % and 14 mole %.

6. The conversion element according to claim 1, wherein the glass composition is free of boron trioxide, germanium oxide, phosphates, halides, $P_2O_5$ and $SiO_2$.

7. The conversion element according to claim 1, wherein $R^2$ is selected from the group consisting of Al, La, Y and Bi, and wherein $R^2_2O_3$ has a proportion of between 1.5 mole % and 2.5 mole %.

8. The conversion element according to claim 1, wherein the glass composition consists essentially of tellurium oxide, $M^1_2O$ and $R^2_2O_3$, and wherein $R^2_2O_3$ has a proportion of between 1.5 mole % and 2 mole %.

9. The conversion element according to claim 1, wherein the glass composition has a glass transformation temperature of less than 320° C. and a dilatometric softening temperature of less than 400° C.

10. The conversion element according to claim 1, wherein the glass composition is radiolucent, and wherein at least 90% of an incidental electromagnetic radiation is transmitted from a wavelength range of 380 nm to 800 nm.

11. A component comprising the conversion element according to claim 1.

12. The component according to claim 11, wherein the component comprises a semiconductor chip configured to generate the electromagnetic primary radiation of at least a blue spectral range, and wherein the conversion element is arranged directly on the semiconductor chip.

13. The component according to claim 11, wherein the component comprises a semiconductor chip, and wherein the conversion element is spatially separated from the semiconductor chip.

14. The component according to claim 11, wherein the component comprises a semiconductor chip or a substrate, wherein the semiconductor chip is configured to generate the electromagnetic primary radiation of at least a blue spectral range, wherein the conversion element connects an additional layer with the semiconductor chip or the substrate, and wherein the additional layer is a ceramic conversion element.

15. A method for producing a component, the method comprising:
    providing at least one semiconductor chip, which has a radiation exit surface, or a substrate;
    attaching the conversion element pursuant to claim 1 on the radiation exit surface or on the substrate; and
    heating the component to a maximum of 400° C., so that a composite is generated between the radiation exit surface or the substrate and the conversion element.

16. The method according to claim 15, wherein attaching the conversion element on the radiation exit surface or the substrate comprising the conversion element as powder or as prefabricated body.

17. The method according to claim 15, wherein the conversion element is generated by a glass composition designed as a layer, the glass composition being coated with at least one phosphor, and wherein the phosphor subsequently sinks into the glass composition.

18. The method according to claim 15, wherein the conversion element is generated by introducing a phosphor into the glass composition and subsequently attaching such phosphor-glass composition mixture on the radiation exit surface or to the substrate.

* * * * *